(12) United States Patent
Hofmann et al.

(10) Patent No.: US 9,014,841 B2
(45) Date of Patent: Apr. 21, 2015

(54) DEVICE AND METHOD FOR REMOVING TESTED SEMICONDUCTOR COMPONENTS

(71) Applicant: Multitest elektronische Systeme GmbH, Rosenheim (DE)

(72) Inventors: Thomas Hofmann, Stephanskirchen (DE); Klaas Akkermann, Rosenheim (DE); Stefan Kurz, Rosenheim (DE); Andreas Nagy, Munich (DE); Johann Pötzinger, Fischbachau (DE); Bernhard Lorenz, Marzling (DE)

(73) Assignee: Multitest Elektronishche Systeme GmbH, Rosenheim (DE)

( * ) Notice: Subject to any disclaimer, the term of this patent is extended or adjusted under 35 U.S.C. 154(b) by 0 days.

(21) Appl. No.: 13/914,603

(22) Filed: Jun. 10, 2013

(65) Prior Publication Data
US 2013/0338818 A1 Dec. 19, 2013

(30) Foreign Application Priority Data
Jun. 13, 2012 (EP) .................................... 12171824

(51) Int. Cl.
*G06F 7/00* (2006.01)
*H01L 21/67* (2006.01)
*G01R 31/28* (2006.01)

(52) U.S. Cl.
CPC ...... *H01L 21/67271* (2013.01); *G01R 31/2893* (2013.01)

(58) Field of Classification Search
None
See application file for complete search history.

(56) References Cited

U.S. PATENT DOCUMENTS

| 5,307,011 | A | 4/1994 | Tani |
| 5,477,160 | A | 12/1995 | Love |
| 7,080,652 | B2 * | 7/2006 | Davis et al. .................... 134/133 |
| 2002/0054813 | A1 | 5/2002 | Davidov et al. |
| 2006/0012389 | A1 | 1/2006 | Cram |
| 2007/0045536 | A1 * | 3/2007 | Nakasuji et al. ............... 250/310 |
| 2010/0055296 | A1 * | 3/2010 | Bankmann et al. ............... 427/8 |
| 2010/0206768 | A1 | 8/2010 | Hofmann et al. |
| 2011/0265316 | A1 | 11/2011 | Na et al. |
| 2012/0048298 | A1 | 3/2012 | Humphrey et al. |
| 2012/0100709 | A1 * | 4/2012 | Minami ........................ 438/597 |

FOREIGN PATENT DOCUMENTS

EP 2 302 399 A2 3/2011
WO WO 2009/100910 A1 8/2009

OTHER PUBLICATIONS

European Search Report of corresponding EP 12171824.1, dated Dec. 10, 2012, 5 pages.

* cited by examiner

*Primary Examiner* — Yolanda Cumbess
(74) *Attorney, Agent, or Firm* — Christie, Parker & Hale, LLP

(57) ABSTRACT

A device for removing tested semiconductor components from a clamping carrier having fixed stop elements and movable clamping elements, pre-tensioned by spring elements includes an actuation device arranged above the clamping carrier, which moves the clamping elements into an opening position enabling the clamping carrier to be discharged, and then moves the clamping elements into a rest position after discharge, an intermediate carrier, positioned under the clamping carrier during discharge, onto which the clamping carrier is emptied, a data memory in which data about each semiconductor component are stored, and a removal device, which removes the semiconductor components from the intermediate carrier and sorts them into at least two different categories in accordance with the data stored in the data memory.

20 Claims, 2 Drawing Sheets

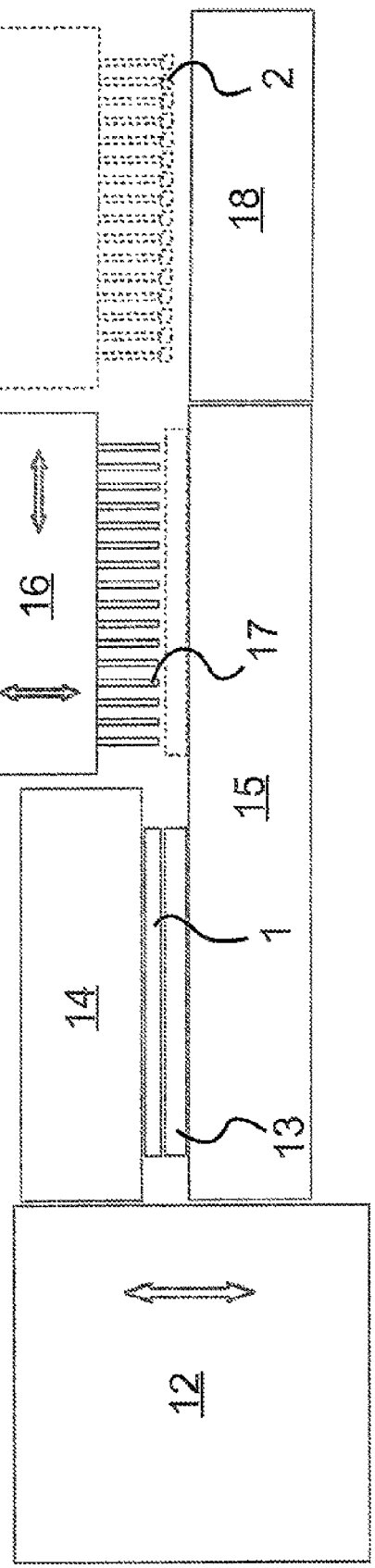
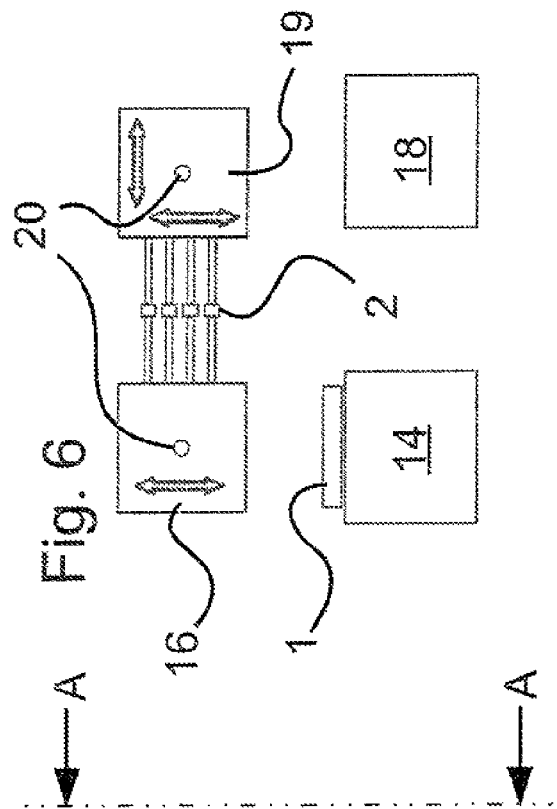
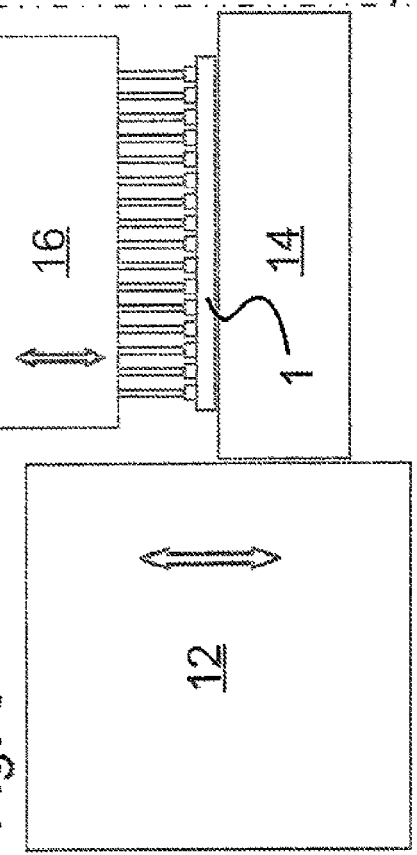

DEVICE AND METHOD FOR REMOVING TESTED SEMICONDUCTOR COMPONENTS

CROSS-REFERENCE TO RELATED APPLICATION(S)

This application claims priority to and the benefit of the filing date of the European Patent Application No. 12171824.1 filed 13 Jun. 2012, the disclosure of which is hereby incorporated herein by reference.

FIELD OF THE INVENTION

The invention relates to a device and to a method for a removal of tested semiconductor components.

BACKGROUND OF THE INVENTION

After their production, electronic semiconductor components, such as integrated circuits, processors, sensor elements etc., are usually subjected to specific tests to verify their functions. This includes both the electronic and, for example, sensor-related functions. Recently, so-called clamping carriers have become known, on which a plurality of electronic component devices can be attached. These carriers are then passed to a so-called handler in which they are positioned exactly for testing.

The handler has a fixed test head, to which a test socket, also fixed, is connected. For electronic tests this test socket is designed such that normally all semiconductor components on the clamping carrier are contacted and can be tested simultaneously.

During the test a file is stored for each clamping carrier, in which either the test result for each semiconductor component of the clamping carrier is recorded, or which only contains the information for each semiconductor component as to which category the semiconductor component is to be classified in. This the is stored either on a central computer, the clamping carrier itself or in a cassette which receives a plurality of such clamping carriers.

SUMMARY OF THE INVENTION

There may be a need to provide a device or a method respectively, in order to remove the semiconductor components from the clamping carrier and to feed the semiconductor components assessed as good to a package based on their classification. The packaged semiconductor components are intended to be able to be processed in standard automatic placement machines.

According to an embodiment of the invention a device having the features of Claim 1 and a method having the features of Claim 9 are provided.

According to an embodiment of the invention a first exemplary embodiment has the following features: an actuation device arranged above the clamping carrier, which moves the clamping elements into an opening position enabling the clamping carrier to be discharged and then after discharge into a rest position, an intermediate carrier positioned under the clamping carrier during the discharge, onto which intermediate carrier the clamping carrier is emptied, a data memory in which data are stored for each semiconductor component, and a removal device which removes the semiconductor components from the intermediate carrier and sorts them into at least two different categories according to the data stored in the data memory.

In this exemplary embodiment either the clamping carrier can already be fed in such a manner that the semiconductor components are located at its underside. If the clamping carrier is fed in normal orientation, with the semiconductor components on its top face, an additional device must be provided which rotates the clamping carrier about a horizontal axis prior to its discharge.

In both cases, after the opening of the clamping elements the semiconductor components will detach themselves from the clamping carrier under the force of gravity alone and will fall into the intermediate carrier. The semiconductor components are now oriented in a direction opposite to their orientation on the clamping carrier. In this orientation they can be fed to the package.

Data about each semiconductor component can be stored on the clamping carrier. The data can be generated during the testing of the semiconductor components and written directly to a memory there on the clamping carrier. Usually, the test data are stored on a central computer and are assigned to a clamping carrier using an identification code. As soon as the clamping carrier is detected using this code in the removal device, the data for the semiconductor components of this clamping carrier are retrieved from the central computer.

The data stored for each semiconductor component can contain different information. Thus the data can be the pure test results which are first evaluated in the removal device, in order then to make a decision about the further treatment of the semiconductor component. This decision can however also be taken earlier in the central computer or in the test device, so that the data read in by the removal device now only relate to the category to which the respective semiconductor component has been assigned.

The categories into which the semiconductor components are sorted in the removal device, are at least one category which indicates that all functions of the semiconductor component are fulfilled, and a further category, which must be disposed of as wastage.

A second exemplary embodiment of the invention has the following features: an actuation device which moves the clamping elements into an opening position enabling the clamping carrier to be removed and then after removal into a rest position, a data memory in which data about each semiconductor component are stored, a removal device which removes the semiconductor components from the clamping carrier, and a rotation device for rotating semiconductor components removed from the clamping carrier about an axis perpendicular to the direction of removal.

A rotation device here is understood as a device which accepts the semiconductor components such that they can be stored in a rotated orientation, i.e. with what was previously the underside now facing upwards.

In this exemplary embodiment the clamping carriers are fed to the removal device such that the semiconductor components are located on the top of the clamping carrier. Because the semiconductor components here are removed from the clamping carrier in the orientation in which they are also pressed against the test socket in the test device, they must be rotated before they are fed to a package, so that the side facing towards the clamping carrier comes to rest facing upwards. The rotation device can be arranged next to, below or above the removal device.

Both the removal device and the rotation device have at least one suction needle, with which a semiconductor component is held by the creation of a vacuum. The semiconductor component is passed to the suction needle of the rotation device by the suction needle of the removal device in such a way that both suction needles face each other and are positioned on opposite sides of the semiconductor component.

If the rotation device is arranged above the removal device, to transfer the semiconductor component or semiconductor components, the removal device is rotated by 180° about a horizontal axis, aligned perpendicular to the direction of removal, so that the suction needle or suction needles stand up vertically. The suction needle or suction needles of the rotation device are now positioned directly opposite to the suction needles of the removal device, viewed from above, on the semiconductor component or on the semiconductor components.

After being accepted by the rotation device this can be moved in the XY-direction, in order to transfer the semiconductor components to the package. If the rotation device is arranged next to the removal device, then the removal device pivots by only 90° in order to transfer the semiconductor components. After the transfer the rotation device also rotates by 90°, so that the suction needles of the rotation device are aligned downwards again. Here also, the semiconductor components can then be transferred to a package by displacement in the XY-direction. If the rotation device is arranged below the removal device however, then the removal device must first be moved in order to be positioned above the rotation device. The suction needles of the rotation device are positioned vertically upwards to transfer the semiconductor components. After the transfer the rotation device pivots by 180° and can transfer the semiconductor components directly downwards to the package.

A negative test result for a semiconductor component can result either from the fact that the semiconductor component does not fulfil all functions, but it can also be due to the fact that proper contacting was not made between test socket and semiconductor component during the test. Such errors can be caused by grains of dust, for example. Previously, such semiconductor components were disposed of as wastage. Where expensive semiconductor components are concerned, however, it makes perfect sense to test such semiconductor components a second time. Therefore, a device for aligning semiconductor components to be re-tested on a clamping carrier is preferably provided, with fixed stop elements and movable clamp elements pre-tensioned by spring elements, with an actuation device for moving the clamping elements into an opening position, which enables the placing of the semiconductor components by means of the aligning device, and for moving the clamping elements into a clamping position after placing the semiconductor components.

Thus, an empty clamping carrier is kept ready, into which such semiconductor components to be tested again can be sorted. The re-sorted semiconductor components must have the same orientation as they originally had in the clamping carrier. In a device according to the first exemplary embodiment an aligning device is provided in the form of a rotation device, which accepts such components, already rotated by means of the intermediate carrier, directly from the removal device and turns them back. The rotation device can be offset to the side, for example, below the removal device, the removal device must be moved in a plane in order to transfer the semiconductor component to be re-tested to the rotation device. After the transfer this pivots by 180° and deposits the semiconductor component onto a clamping carrier on a plane below the clamping carrier from which it was removed, in the correct orientation.

In the case of a device according to the second exemplary embodiment the alignment device is represented by the removal device. Since the semiconductor components here are directly removed from the clamping carrier by the removal device, they can be inserted into another clamping carrier again in the same orientation. The rotation of the semiconductor components here is therefore only necessary for the packaging but not for the re-testing.

Advantageously a holder for cassettes is provided, from which empty clamping carriers can be removed and into which clamping carriers populated with semiconductor components to be tested again can be inserted. This enables the automated collection of such semiconductor components to be re-tested. The cassette can then be subjected to the completely standard test procedure again, without the need for special measures to be taken.

The transfer between a handler, in which the semiconductor components are tested, and the removal device could be performed directly, by each clamping carrier being passed by the handler directly to the removal device after the test. However, it has been established that when such a direct transfer is used, if a fault occurs in one of the two devices this can result in long downtimes. Since the removal device essentially always works at the same speed, but the testing speed is strongly dependent on the tests to be carried out, when using direct transfer no corresponding adjustment could be made either. According to an embodiment of the invention a holder for cassettes is therefore provided, from which clamping carriers populated with tested semiconductor components can be removed. Since the handler also deposits the tested semiconductor components on the clamping carriers in cassettes, in this way an arbitrarily large buffer store is realised, via which the various device speeds can be equalised.

In order to dispose of the bad semiconductor components that do not fulfil the required functions in a controlled manner, a container is provided in which those tested semiconductor components are deposited, which according to the data stored in the data store are unusable.

While the "bad" semiconductor components must be disposed of, the "good" semiconductor components must be packaged. To do this, they must be loaded, for example, into belts that are compatible with the standard automatic placement machines. A packaging device is therefore advantageously provided, which picks up those tested semiconductor components which according to the data stored in the data store are in good condition, and transfers them to a package.

If the clamping carrier itself is not equipped with a data store or there is no data store attached to the cassette, then the data on the semiconductor components mounted on the clamping carrier must be scanned by a central computer. In order to be able to assign the scanned data to the respective clamping carrier, a reader is provided for reading a code attached to the clamping carrier. The code can be configured, for example, as a hole code for a transmitted light scanner or as a barcode for an incident-light scanner.

According to an embodiment of the invention a clamping carrier with tested semiconductor components is removed from a cassette, accurately positioned, identified by means of a code, and data on each tested semiconductor component are scanned in. The clamping elements of the clamping carrier are moved into an opening position enabling the removal of the semiconductor components, the semiconductor components are emptied from the clamping carrier onto an intermediate carrier and the clamping elements are moved into a rest position. The empty clamping carrier is inserted into a cassette and the semiconductor components are removed from the intermediate carrier, and according to the scanned data, sorted into at least two different categories. This first method can be carried out, for example, on a device according to the first exemplary embodiment.

In a second method, which can be carried out for example on the device according to the second exemplary embodiment, a clamping carrier with tested semiconductor components is removed from a cassette, is precisely positioned and is identified by a code. Data on each tested semiconductor component are read, the clamping elements are moved into an opening position enabling the removal of the semiconductor components, the semiconductor components are removed from the clamping carrier, the clamping elements moved into a rest position and the empty clamping carrier is inserted into a cassette again. Semiconductor components which are categorized at least as good are rotated about an axis perpendicular to the direction of removal.

In the case of the semiconductor components categorized as good the rotation is necessary in order to be able to package them in the correct orientation. In the case of semiconductor components which have been categorized as bad, it is immaterial whether or not they are rotated. They can be disposed of by both the removal device and by the rotation device. If the removed semiconductor components include some which are to be re-tested, these must not be rotated, or must be rotated back, because they must be inserted into another clamping carrier in the non-rotated orientation.

Due to the handling of the semiconductor components after the test, damage may occur that may also adversely affect the functioning of the semiconductor components. Such damage, which is caused by external effects, can usually also be identified from the outside, since scratches, dents or chips can be detected on the semiconductor components. In order to eliminate such damage, semiconductor components which have been tested and which have been approved as in order are visually inspected on all sides with a camera after removal from the clamping carrier.

If some semiconductor components are also categorized as needing to be tested again, the best method for their further processing must be identified. This is largely dependent on the occurrence or on the frequency. If the frequency is fairly high, it is practical to insert semiconductor components into clamping carriers in turn and to return these clamping carriers into the normal testing process. For lower frequencies, tubes or other canisters can be used. Semiconductor devices in these canisters must then be channeled back into the process before population of the clamping carriers, or must be subjected to an individual test.

BRIEF DESCRIPTION OF THE DRAWINGS

Further details and advantages of the invention are obtained from the dependent claims in combination with the description of an exemplary embodiment, which will be described in detail with reference to the drawing.

FIG. 4 is a schematic representation of a first exemplary embodiment of the device according to an embodiment of the invention;

FIG. 5 is a second exemplary embodiment with a rotation device for the semiconductor components; and FIG. 6 is a side view of the second exemplary embodiment in the direction of the arrows A in FIG. 5.

DETAILED DESCRIPTION

Figure 1:
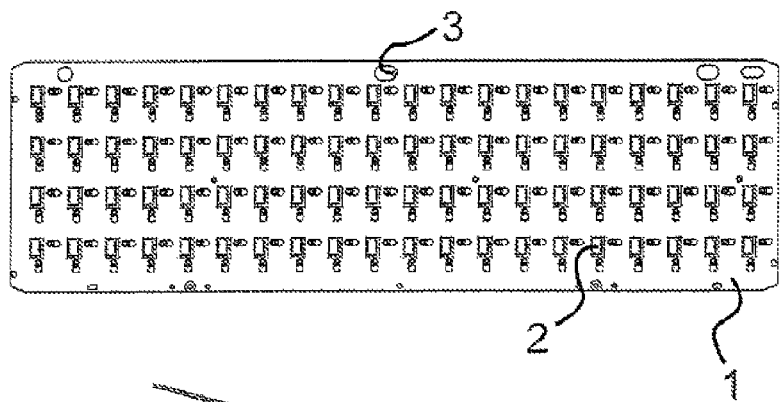
FIG. 1 is a plan view of a clamping carrier populated with semiconductor components.

In FIG. 1 the clamping carrier 1, which here contain 80 individual semiconductor components 2, can be identified. A positioning opening 3 serves to allow precise positioning of the clamping carrier 1. Due to the very small size of the semiconductor components 2 this very accurate positioning is necessary both during the population of the clamping carrier 1 and the removal of the semiconductor components 2 from the clamping carrier 1, but in particular also during the testing of the semiconductor components 2. The extremely small contacts of the semiconductor components 2 must be precisely met by the test probes.

Figure 2:
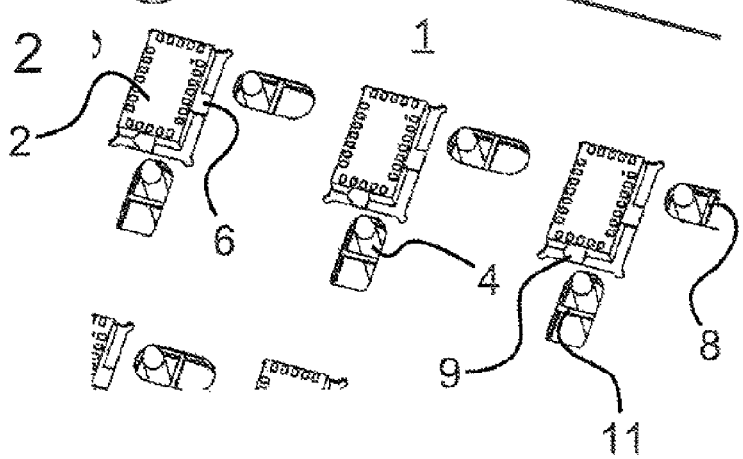
FIG. 2 is a magnified excerpt of the clamping carrier of FIG. 1.

The extract from the clamping carrier 1 illustrated in FIG. 2 shows that the semiconductor components 2 are pressed by a transverse clamping element 6 and a longitudinal clamping element 9 against two fixed stop edges, which are formed by the cover plate of the clamping carrier 1, not specifically labelled here, visible in FIG. 1 and FIG. 2.

Figure 3:
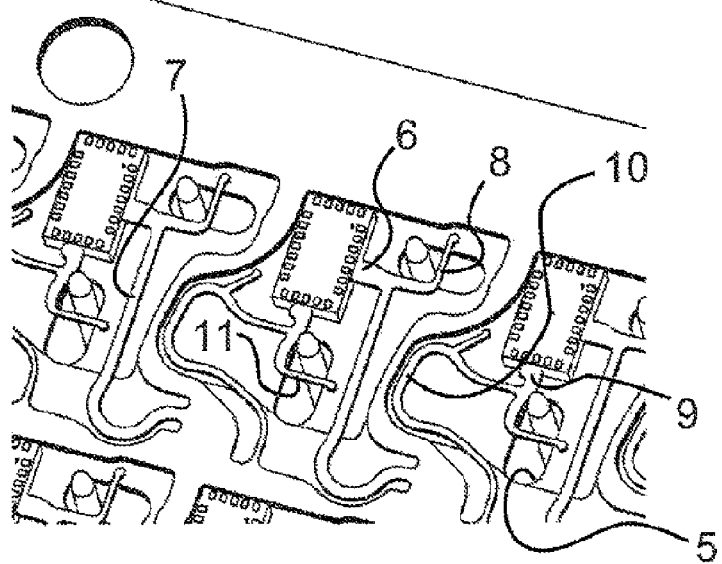
FIG. 3 is the excerpt of FIG. 2 without a cover plate.

The precise function can be better identified from FIG. 3, in which this cover plate has been removed and the mechanism of the clamping elements is open to view. The transverse clamping element 6 is connected to the transverse clamping spring 7 and the transverse clamping lever 8. In contrast, the longitudinal clamping element 9 is in connection with the longitudinal clamping spring 10 and the longitudinal clamping lever 11. The clamping elements 6 and 9 are actuated by the actuator pins 4 which engage on the clamping levers 8 and 11. The clamping force is generated by the respective clamping spring 7 or 10.

When populating the clamping carrier 1 with the semiconductor components 2, after insertion of the semiconductor components 2 the longitudinal clamping element 9 is first dosed, because its clamping force is less. At the same time the longitudinal clamping element 9 pushes the semiconductor component 2 against the stop edge opposite to it, without any clamping force yet being generated by the transverse clamping element 6. Not until the longitudinal clamping element 9 has been dosed the transverse clamping element 6 is also dosed, which via its transverse clamping spring 7 generates a force which also presses the semiconductor component 2 against the clamping force applied by the longitudinal clamping element 9 against the opposite stop edge.

The actuator pins 4 protrude through the access opening 5 into the clamping carrier 1 and are activated by the actuation device not shown here. To remove the semiconductor components 2 from the clamping carrier 1, the actuator pins 4 are moved within the access openings 5 such that they press on the clamping levers 8 and 11 and in so doing pull the clamping elements 6 and 9 away from the semiconductor components 2. These are now free and can be removed.

In FIGS. 4 and 5 components are drawn in solid lines in a first position and in dashed lines in a second position. Equivalent components are also provided with the same reference numerals. The double arrows always indicate the direction in which the corresponding component can be moved.

The embodiment according to FIG. 4 has a cassette 12 which can be moved upwards and downwards. All of the clamping carriers 1 it contains can thus be removed on a single plane. In the lowest position of the cassette 12 therefore the topmost clamping carrier 1 can be removed, and in the topmost position the lowest clamping carrier 1 can be removed. The cassette 12 is oriented such that the semiconductor components are located on the underside of the clamping carriers it contains.

Above the removed clamping carrier 1 is located the actuation device 14, which engages with the clamping carrier 1 with its actuator pins 4 and actuates the clamping levers 8 and 11. The actuation device 14 has a guide, not shown here, which receives the clamping carrier 1, positions it accurately and holds it in this position.

Below the clamping carrier 1 there is located the intermediate carrier 13, in which the removed semiconductor components 2 are deposited. The intermediate carrier 13 is mounted on the displacement table 15, by means of which the intermediate carrier 13 can be moved into the dashed position underneath the removal device 16. The removal device 16 can be moved up and down according to the double arrows, and left and right. It is fitted with the suction needles 17, which are lowered onto the semiconductor components 2 in the intermediate carrier 13 and raised again after the semiconductor components 2 have been picked up by suction.

Next to the displacement table 15, the packaging device 18 is arranged, over which the removal device 16 can be moved. By lowering the removal device 16, the semiconductor components 2 can be placed on the packaging device 18.

The removal device 16 can be equipped with an array of suction needles 17, so that all semiconductor components 2 can be removed from the intermediate carrier 13 at the same time. With such a removal device 16 a plurality of belts can be populated with semiconductor components 2 in the packaging device 18. It is also possible to equip the removal device 16 with only one row of suction needles 17, so that only one belt is populated in the packaging device 18. But it is also possible to perform individual removal from the intermediate carrier 13 with a small removal device 16 having only one suction needle 17.

If a semiconductor component is located in the clamping carrier 1 which needs to be weeded out, then the removal device 16 with the semiconductor components 2 already removed from the intermediate carrier 13 travels into a specific position above a waste bin, not shown here, where it deposits this faulty component. Ideally, this takes place after depositing the good components on the packaging device 18, so that the good semiconductor components obtain secure packaging as quickly as possible, and undamaged.

If the semiconductor components 2 are not only to be sorted into two categories, namely the category of "working" and the category of "defective", but also into the additional category "to be tested again", then ideally a small rotation device with only one suction needle is provided in front of or behind the packaging device 18 in the viewing direction. The suction needle of this rotation device, not shown in the drawing, is aligned upwards. In this way the removal device 16 can first be moved, for example, so that the semiconductor components 2 evaluated as good can be placed on the packaging device 18, whereupon the removal device 16 moves in such a manner that a semiconductor component to be re-tested is positioned directly above the suction needle and can be picked up by this, and only then the defective semiconductor components are disposed of in the waste bin. After the transfer of the semiconductor component to be tested again, the rotation device pivots 180° downwards and deposits the semiconductor component on an additional clamping carrier, which is arranged in a plane below the first clamping carrier 1. By means of this transfer the semiconductor component 2 can be again placed on the additional clamping carrier in the orientation in which it can be contacted by the test socket of a test device.

Of course the rotation device can also be arranged above the removal device 16 or to the side thereof. In these two cases, however, the removal device 16 must also be suspended so that it can rotate.

In the following, the operation of the exemplary embodiment 1 according to FIG. 4 will be described in more detail. The cassette 12 is moved into a position in which the first clamping carrier 1 can be removed. This is pushed into the guide of the actuation device 14 where it is accurately positioned. Using a code attached to the clamping carrier 1 this is identified and the data associated with it are read in by a central computer. The data show which of the semiconductor components 2 are in working order, which are faulty and which need to be tested again.

The actuator pins 4 are moved by the actuation device 14 into the access openings 5 and the clamping levers 8 and 11 are thereby activated. This will open the clamping elements 6 and 9, so that no further retaining force is exerted on the semiconductor components 2. In contrast to the population of the clamping carriers, during the emptying process the clamping levers can be activated at the same time.

Under their own weight, semiconductor components 2 drop into the intermediate carrier 13, which is correspondingly partitioned, so that the semiconductor components 2 are also precisely positioned here. The semiconductor components 2 are now oriented with the side that had originally lain on the clamping carrier 1 now facing upwards. As soon as the semiconductor components 2 are placed in the intermediate carrier 13, the empty clamping carrier 1 can be moved back into the cassette 12, and the next filled clamping carrier can be loaded from the cassette 12, can be positioned, and the associated data can be read in. But it is also possible to use a second cassette, into which the empty clamping carriers are transferred.

The intermediate carrier 13 is then moved under the removal device 16 and is again precisely positioned. The removal device 16 is moved downwards until the suction needles 17 are seated on the semiconductor components 2 in the intermediate carrier 13. The vacuum now created holds the semiconductor components 2 in place, so that when the removal device 16 is pulled up they are removed from the intermediate carrier 13 and together with the suction needles 17, they are moved upwards.

As soon as the semiconductor components 2 are clear of the intermediate carrier 13, the intermediate carrier 13 can be moved back and again filled with semiconductor components from the next clamping carrier. Meanwhile, the removal device 16 is moved sideways and positioned above the packaging device 18. There, the semiconductor components 2 which have been approved according to the scanned data are first deposited, by the vacuum to the corresponding suction needles 17 being switched off. If the removed semiconductor components 2 include a component to be retested, the removal device 16 is moved forward in the direction of view, in front of the packaging device 18, and this semiconductor component is transferred to the rotation device, not shown here, which then deposits the component in a further clamping carrier, also not shown.

If a defective semiconductor component 2 is also present, the removal device 16 then moves behind the packaging device 18 in the direction of view, and discards this component via a waste bin.

FIG. 5 shows an alternative design variant. In this exemplary embodiment the cassette 12 is placed such that the semiconductor components 2 are located on the top of the clamping carriers 1 it contains. Here no intermediate carrier 13 is provided, so that the semiconductor components 2 can be removed directly from the clamping carrier 1 by the removal device 16. The process of opening up the clamping elements is the same as has already been described in the exemplary embodiment 1. Here, however, the actuation device 14 is located underneath the clamping carrier 1, because the clamping carrier 1 is also oriented the other way round. The packaging device 18 here is located behind the control 14 in the viewing direction. This can be clearly seen from the side view in the direction of the arrows A in FIG. 6.

After the opening of the tensioning elements and the transfer of the semiconductor components 2 by means of the suction needles 17 of the removal device 16, this is moved upwards until it is clear of the semiconductor components 2. The removal device 16 is then pivoted by 90° (see FIG. 6) about a horizontal axis 20 aligned perpendicular to the direction of removal, and then fixed in this position. The rotation device 19, waiting in the mirror-reflected position, is now moved towards the removal device 16 until the suction needles of the rotation device 19 touch the semiconductor components 2. The vacuum in the suction needles of the rotation device 19 is then activated and the vacuum in the suction needles of the removal device 16 is switched off. The semiconductor components 2 are then picked up by the suction needles of the rotation device 19, so that these can move a short distance away from the removal device 16.

The rotation device 19 now pivots downwards by 90° about its rotational axis 20, and so by means of an additional lowering is able to place the semiconductor components 2 onto the packaging device 18. The storage in three different categories has already been described with reference to the exemplary embodiment 1 and will therefore not be explained again here. Of course in this embodiment also, the empty clamping carrier 1 can be pushed back into the cassette 12, or rather transported into another empty cassette. Also, the removal device 16 and the rotation device 19, as is also the case in exemplary embodiment 1, can be equipped with a single suction needle 17, a row of suction needles 17 or a suction needle array.

What is claimed is:

1. A device for removing tested semiconductor components from a clamping carrier, having fixed stop elements and movable clamping elements, pre-tensioned by spring elements comprising:
   an actuation device arranged above the clamping carrier, which moves the clamping elements into an opening position enabling the clamping carrier to be discharged, and then into a rest position after discharge;
   an intermediate carrier, positioned under the clamping carrier during discharge, onto which the clamping carrier is emptied;
   a data memory in which data about each semiconductor component are stored; and
   a removal device, which removes the semiconductor components from the intermediate carrier and sorts them into at least two different categories in accordance with the data stored in the data memory.

2. The device according to claim 1, further comprising a device for aligning semiconductor components to be tested again on a clamping carrier, having fixed stop elements and movable clamp elements pre-tensioned by spring elements is provided, with an actuation device for moving the clamping elements into an opening position, which enables the placement of the semiconductor components by means of the alignment device, and for moving the clamping elements into a clamping position after the placement the semiconductor components.

3. The device according to claim 2, further comprising a holder for cassettes from which empty clamping carriers can be removed and into which clamping carriers populated with semiconductor components to be tested again can be inserted.

4. The device according to claim 1, further comprising a holder for cassettes from which clamping carriers populated with tested semiconductor components can be removed.

5. The device according to claim 1, further comprising a container into which tested semiconductor components which according to the data stored in the data memory are unusable, are placed.

6. The device according to claim 1, further comprising a packaging device which picks up those tested semiconductor components which according to the data stored in the data store are in working order, and transfers them to a package.

7. The device according to claim 1, further comprising a reader for reading a code attached to the clamping carrier.

8. A device for removing tested semiconductor components from a clamping carrier, having fixed stop elements and movable clamping elements, pre-tensioned by spring elements, comprising:
   an actuation device which moves the clamping elements into an opening position enabling the clamping carrier to be removed, and then moves the clamping elements into a rest position after removal;
   a data memory in which data about each semiconductor component are stored;
   a removal device which removes the semiconductor components from the clamping carrier; and
   a rotation device for rotating semiconductor components removed from the clamping carrier about an axis perpendicular to the direction of removal.

9. The device according to claim 8, further comprising a device for aligning semiconductor components to be tested again on a clamping carrier, having fixed stop elements and movable clamp elements pre-tensioned by spring elements is provided, with an actuation device for moving the clamping elements into an opening position, which enables the placement of the semiconductor components by means of the alignment device, and for moving the clamping elements into a clamping position after the placement the semiconductor components.

10. The device according to claim 9, further comprising a holder for cassettes from which empty clamping carriers can be removed and into which clamping carriers populated with semiconductor components to be tested again can be inserted.

11. The device according to claim 8, further comprising a holder for cassettes from which clamping carriers populated with tested semiconductor components can be removed.

12. The device according to claim 8, further comprising a container into which those tested semiconductor components which according to the data stored in the data memory are unusable, are placed.

13. The device according to claim 8, further comprising a packaging device which picks up those tested semiconductor components which according to the data stored in the data store are in working order, and transfers them to a package.

14. The device according to claim 8, further comprising a reader for reading a code attached to the clamping carrier.

15. A method for removing tested semiconductor components from a clamping carrier having fixed stop elements and movable clamping elements, pre-tensioned by spring elements, comprising the steps of:
   removing a clamping carrier with tested semiconductor components from a cassette, which is precisely positioned and is identified by a code;
   reading data on each tested semiconductor component;
   moving the clamping elements into an opening position enabling the removal of the semiconductor components;
   discharging the semiconductor components from the clamping carrier onto an intermediate carrier and moving the clamping elements into a rest position;
   inserting the empty clamping carrier into a cassette again; and removing the semiconductor components from the intermediate carrier and sorting into at least two different categories according to the data that is read in.

16. The method according to claim 15, wherein after removal from the clamping carrier, tested and approved semiconductor components are visually inspected on all sides by a camera.

17. The method according to claim 15, wherein after removal from the clamping carrier, semiconductor components to be tested again are inserted into another clamping carrier, into tubes or into other canisters.

18. A method for removing tested semiconductor components from a clamping carrier having fixed stop elements and movable clamping elements, pre-tensioned by spring elements, comprising the steps of:

removing a clamping carrier with tested semiconductor components from a cassette which is precisely positioned and is identified by a code;

reading data about each tested semiconductor component;

moving the clamping elements into an opening position enabling the removal of the semiconductor components;

removing the semiconductor components from the clamping carrier and moving the clamping elements into a rest position; and inserting the empty clamping carrier into a cassette again, wherein at least the semiconductor components which are categorized as good are rotated about an axis perpendicular to the direction of removal.

19. The method according to claim 18, wherein after removal from the clamping carrier, tested and approved semiconductor components are visually inspected on all sides by a camera.

20. The method according to claim 18, wherein after removal from the clamping carrier, semiconductor components to be tested again are inserted into another clamping carrier, into tubes or into other canisters.

* * * * *